(12) United States Patent
Itoh

(10) Patent No.: US 6,232,763 B1
(45) Date of Patent: May 15, 2001

(54) MAGNETO-OPTICAL ELEMENT AND OPTICAL MAGNETIC FIELD SENSOR

(75) Inventor: Nobuki Itoh, Katano (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/168,905

(22) Filed: Oct. 9, 1998

Related U.S. Application Data

(62) Division of application No. 08/769,374, filed on Dec. 19, 1996, now Pat. No. 5,861,741, which is a division of application No. 08/547,870, filed on Oct. 25, 1995, now Pat. No. 5,635,830, which is a division of application No. 08/214,462, filed on Aug. 18, 1994, now Pat. No. 5,485,079.

(30) Foreign Application Priority Data

Mar. 29, 1993 (JP) .......... 5-69631
Jun. 1, 1993 (JP) .......... 5-130817

(51) Int. Cl.[7] .................. G01R 33/02
(52) U.S. Cl. ..................... 324/96
(58) Field of Search .......... 324/96, 117 R, 324/244.1, 750, 753; 359/280, 281–283, 394; 250/225, 231.1, 227.14; 385/33

(56) References Cited

U.S. PATENT DOCUMENTS

| H371 | 11/1987 | Bobb . | |
|---|---|---|---|
| 3,580,664 | * 5/1971 | Bongers et al. | 359/281 |
| 4,604,577 | 8/1986 | Matsumura et al. . | |
| 4,683,421 | 7/1987 | Miller et al. . | |
| 4,698,497 | 10/1987 | Miller et al. . | |
| 4,823,083 | 4/1989 | Meunier et al. . | |
| 5,075,546 | 12/1991 | Kamada et al. . | |
| 5,140,156 | 8/1992 | Imaeda et al. . | |
| 5,157,324 | 10/1992 | Chollet . | |
| 5,202,629 | 4/1993 | Seike et al. . | |
| 5,212,446 | 5/1993 | Itoh et al. . | |
| 5,214,282 | * 5/1993 | Yamaguchi et al. | 250/306 |
| 5,402,509 | * 3/1995 | Fukushima | 385/33 |
| 5,483,161 | * 1/1996 | Deeter et al. | 324/244.1 |

FOREIGN PATENT DOCUMENTS

| 86387 | 8/1983 | (EP) . |
|---|---|---|
| 345759 | 12/1989 | (EP) . |
| 510621 | 10/1992 | (EP) . |
| 62-285081 | 12/1987 | (JP) . |
| 2-85784 | 3/1990 | (JP) . |
| 2-135416 | 5/1990 | (JP) . |
| 2-281169 | 11/1990 | (JP) . |

OTHER PUBLICATIONS

Itoh et al., "Optical Magnetic Field Sensors With High Linearity Using Bi–Substituted Rare Earth Iron Garnets," *The IEEE International Magnetics Conference*, 1995 Digest of Intermag '95, Apr. 18–21, 1995, San Antonio, Texas.

\* cited by examiner

*Primary Examiner*—Vinh P. Nguyen
(74) *Attorney, Agent, or Firm*—Smith, Gambrell & Russell, LLP

(57) ABSTRACT

A magneto-optical element is of a rare-earth iron garnet crystal expressed at least by formula 1, and a element in whose composition range the value of X is set at $0.8 \leq X \leq 1.3$; that of Y at $0.2 \leq Y \leq 0.4$; that of Z at $0.1 \leq Z \leq 0.9$; and that of W at $0 \leq W \leq 0.3$; and R element is made at least one or more kinds of rare-earth elements. An optical magnetic field sensor is composed in such a manner that light diffracted by magnetic domain structure of rare-earth iron garnet crystal can be detected up to a higher-order light by optical fiber on light output side through optical system arrangement. A magnetic field measuring equipment composed of the optical magnetic field sensor has a linearity error of ±1.0% or less within a magnetic field range 5.0 Oe to 200 Oe, and allows a measuring accuracy higher than with prior art equipment.

$$(Bi_X Gd_Y R_Z Y_{3-X-Y-Z})(Fe_{5-W} Ga_W) O_{12} \quad \text{(formula 1)}.$$

5 Claims, 11 Drawing Sheets

MAGNETO-OPTICAL ELEMENT AND OPTICAL MAGNETIC FIELD SENSOR

This application is a divisional of U.S. Patent Application No. 08/769,374, filed Dec. 19, 1996, which issued as U.S. Pat. No. 5,861,741 on Jan. 19, 1999, which was in turn a divisional of U.S. Patent Application No. 08/547,870, filed Oct. 25, 1995, which issued as U.S. Pat. No. 5,635,830 on Jun. 3, 1997, which was in turn a divisional of U.S. Patent Application No. 08/214,462, filed Mar. 18, 1994, which issued as U.S. Pat. No. 5,485,079 on Jan. 16, 1996.

BACKGROUND OF THE INVENTION

1. Field of the Invention

The present invention relates to a magneto-optical element having the Faraday effect and an optical magnetic field sensor composed by the use of the element.

2. Description of Prior Art Example

Recently, in particular, in the field of power industry, there has been proposed and commercially applied magnetic field measuring equipment combining a magneto-optical element having the Faraday effect with an optical fiber, as a method of measuring a magnetic field intensity developing around an electric wire by the use of a light. The method of measuring a magnetic field intensity around a conductor through which a current flows to detect the current is characterized in that, for example, the method has good insulation properties because it uses the light as a medium, and is not subjected to an electromagnetic induction noise, so that the method is considered to be used for transmission/distribution facilities.

FIG. 3 shows a principle diagram of a method of measuring a magnetic field by the use of the Faraday effect. In FIG. 3, a magneto-optical element 14 is arranged in a magnetic field H. An incident light 8a is converted to a linearly polarized light by a polarizer 13 and is caused to pass through the magneto-optical element 14. The plane of polarization thereof is rotated in proportion to the magnetic field intensity H by the Faraday effect. FIG. 3 shows a case where the Faraday rotation exhibits a negative code. The linearly polarized light having been rotated passes through an analyzer 15 whose transmission-polarization direction is made different by 45 degrees from that of the polarizer 13, and then converted in the magnitude of the rotation angle θ thereof to a change in the intensity of an emitted light 8b. In order to compose this magneto-optical converting section, there is generally used an optical magnetic field sensor composed as shown in FIG. 2 (see National Technical Report Vol. 38, No. 2, P. 127, 1992).

In the optical magnetic field sensor composed as shown in FIG. 2, an optical fiber 9 employs multi-mode fibers having a core size 80 μm, and a lens 12 employs self-focussing rod lens having a pitch 0.25. The polarizer 13 and the analyzer 15 employ polarization beam splitters; and a full-reflecting mirror 16 is used to bend an optical path by 90 degrees. The polarization beam splitters and the full-reflecting mirror are cubes whose side each is 5 mm. The magneto-optical element 14 employs a rare-earth iron garnet crystal.

A system using the magnetic field measuring equipment to which such principle is applied has been proposed in which magnetic field measuring units are arranged at a plurality of points in a transmission/distribution line; the electrical outputs from each measuring unit are inputted to an arithmetic unit, where the sum of or difference among the outputs with respect to their waveform is taken as a reference signal; and for example, a zero-phase current in the transmission/distribution line is detected to determine an accident.

However, where a magneto-optical element used for such optical magnetic field sensor employs a ferrimagnetic rare-earth iron garnet crystal, the magnetic domain specific to the rare-earth iron garnet crystal causes the light having transmitted the crystal to be diffracted. The diffracted light is defined as a zero-order light 24, a first-order light 25, a second-order light 26 and the like on a screen 28 from the center thereof, as shown in FIG. 14. In the optical magnetic field sensor composed as shown in FIG. 2, the detection condition of the diffracted light in the lens 12 on the light emitted side is substantially zero-order light detection, so that the output therefrom is expressed by the following equation (1) (see J. Mag. Soc. Jpn., Vol. 14, No. 4 P.642, 1990):

$$V_\phi = \frac{1}{2}\left\{\cos\theta_F + \frac{M}{Ms}\sin\theta_F\right\}^2 \qquad (1)$$

wherein, $\theta_F$ is the Faraday rotation (saturation Faraday rotation) when a material is magnetically saturated and expressed by $\theta_F = F \cdot L$ in which F is a coefficient of the Faraday rotation specific to the material and L is an optical path length (element length); M is a magnetization of the material when a magnetic field is applied to it; and Ms is a magnetization (saturation magnetization) when the material is magnetically saturated.

As a magneto-optical element used for the optical magnetic field sensor as described above, there has been disclosed a rare-earth iron garnet crystal which is expressed by a general formula (chemical formula 1), in which the value of X is set at X=1.3; that of Y at Y=0.1; that of Z at Z=0.1; and that of W at W=0.6 (see U.S. Pat. No. 5,212,446 or the technical report OQE92-105, 1992, of The Institute of Electronics, Information and Communication Engineers). In the prior art, the substitution of Bi or Gd for Y allows a magneto-optical element having good temperature properties. A chemical formula of the crystal used for prior art examples is shown in (formula 3).

$$Bi_XGd_YR_ZY_{3-X-Y-Z}Fe_{5-W}O_{12} \qquad \text{(formula 3)}$$

However, where an optical magnetic field sensor is composed, as shown in FIG. 2, by the use of the magneto-optical element, there has been indicated a linearity error of magnetic field measurement of ±2.0% or less within a range 5.0 Oe to 200 Oe, as shown in FIG. 4, so that there is a problem in practice with respect to the accuracy of a magnetic field measuring equipment.

The linearity error is due to a fact that where the magneto-optical element used for an optical magnetic field sensor employs a Bi-substituted rare-earth iron garnet crystal as described above, when a light is transmitted through the garnet crystal being a ferrimagnetic substance, a light diffraction occurs due to the magnetic domain structure of the garnet crystal, whereby the diffracted light having transmitted the crystal is not completely detected in an optical system on the light emitted side in which only the zero-order light is thus received.

SUMMARY OF THE INVENTION

The present invention is made in view of such points, and it is an object of the invention to improve the measuring accuracy for magnetic fields, to allow a magneto-optical element have good temperature properties around room temperature and a high sensitivity, to compose an optical magnetic field sensor by the use of the element, and to provide magnetic field measuring equipment having a high measuring accuracy.

In order to solve the above-mentioned problems, the present invention provides as a magneto-optical element a Bi-substituted rare-earth iron garnet crystal in whose general formula (chemical formula 1) is $(Bi_XGd_YR_ZY_{3-X-Y-Z})(Fe_{5-W}Ga_W)O_{12}$, wherein the value of X is set at $0.8 \leq X \leq 1.3$; that of Y at $0.1 \leq Y \leq 0.3$; that of Z at $0 \leq Z \leq 1.0$; and that of W at $0 \leq W \leq 0.3$; or a Bi-substituted rare-earth iron garnet crystal in whose general formula (chemical formula 2) the value of X is set at $0.6 \leq X \leq 1.3$; and that of Y at $0.1 \leq Y \leq 0.2$.

The present invention composes an optical system to receive a light up to a higher-order diffracted light than with prior art through an optical fiber on the light emitting side in an optical magnetic field sensor using the above-mentioned magneto-optical element. The invention provides an optical magnetic field sensor and the like in which a polarizer, a magneto-optical element and an analyzer whose transmission-polarization direction is made different from that of the polarizer are arranged along at least the light propagating direction to detect, as an output light intensity, a magnetic field to be measured, characterized in that the core diameter of a second optical fiber provided across the analyzer at one end of the magneto-optical element is larger than the core diameter of a first optical fiber provided across the polarizer at one end of the magneto-optical element on the plane opposite to the second optical fiber.

The present invention provides a magneto-optical element having a high measuring accuracy in a wider magnetic field range with the above-mentioned composition of the magneto-optical element and the optical magnetic field sensor; and the operation thereof will be explained hereinafter.

Equation (1), when expanded, can be expressed as in equation (2).

$$V_\phi \approx \frac{1}{2}\cos^2\theta_F + \frac{\cos\theta_F \sin\theta_F}{Hs} \cdot H + \frac{\sin^2\theta_F}{2Hs^2} \cdot H^2 \quad (2)$$

where $M=\chi H$, in which $\chi$ is magnetic susceptibility. Considering that the applied magnetic field is an alternating current magnetic field, substitution of $H=H_\emptyset \sin \omega t$ in equation (2) causes the output alternating current component to be expressed as in equation (3).

$$V_\phi ac = A \cdot H_\emptyset \sin \omega t + B \cdot H_\emptyset^2 \cdot \sin(2\omega t - \pi/2) \quad (3)$$

where A and B are constants, and expressed as follows:

$$A = \frac{\cos\theta_F \sin\theta_F}{Hs}$$

$$B = \frac{\sin^2\theta_F}{4Hs^2}$$

It will be understood from equation (3) that the equation expressing the output includes the term sin 2ωt, and the coefficient thereof is multiplied by the term of the square of magnetic field intensity, $H_\emptyset^2$. Therefore, for the alternating current magnetic field, the presence of a second higher harmonic with respect to the fundamental harmonic of sin ωt causes a distortion in linearity with respect to magnetic field. Accordingly, the larger the applied magnetic field intensity $H_\emptyset$ becomes, the larger the amplitude of the second higher harmonic becomes in proportion to the square of $H_\emptyset$, so that the linearly of the output becomes worse.

On the other hand, where all-order detection is performed so that all lights up to a high-order diffracted light are to be received, the output from the sensor is expressed as in the following equation:

$$V_r = \frac{1}{2}\left\{1 + \frac{M}{Ms}\sin 2\theta_F\right\} \quad (4)$$

As seen from equation (4), where all-order detection is performed, it is considered that the effective value of the output will be simply proportional to the applied magnetic field, and that the non-linearity of the output due to the presence of a second higher harmonic will not occur.

In such point of view, the present invention makes large the magnetic field in which the magnetic domain structure of a magneto-optical element disappears, that is, the magnetic field Hs which is required to magnetically saturate the garnet crystal by composition control, thereby making small the coefficient B of the second higher harmonic which may cause the distortion in linearity, and allowing the measuring accuracy for the magnetic field to be improved.

Further, in a magnetic field sensor comprising optical components, the present invention composes an optical system in such a manner that it receives the light diffracted in the rare-earth iron garnet crystal being a ferrimagnetic substance, including lights having an order number greater than zero, thereby allowing the measuring accuracy for the magnetic field to be improved.

As apparent from the above description, the present invention makes it possible to provide an optical magnetic field sensor having a higher linearity than with prior art, so that the industrial value of such sensor becomes significant.

DESCRIPTION OF THE PREFERRED EMBODIMENTS

With reference to drawings, embodiments of the present invention will be explained hereinafter.

[Embodiment 1]

Figure 1:
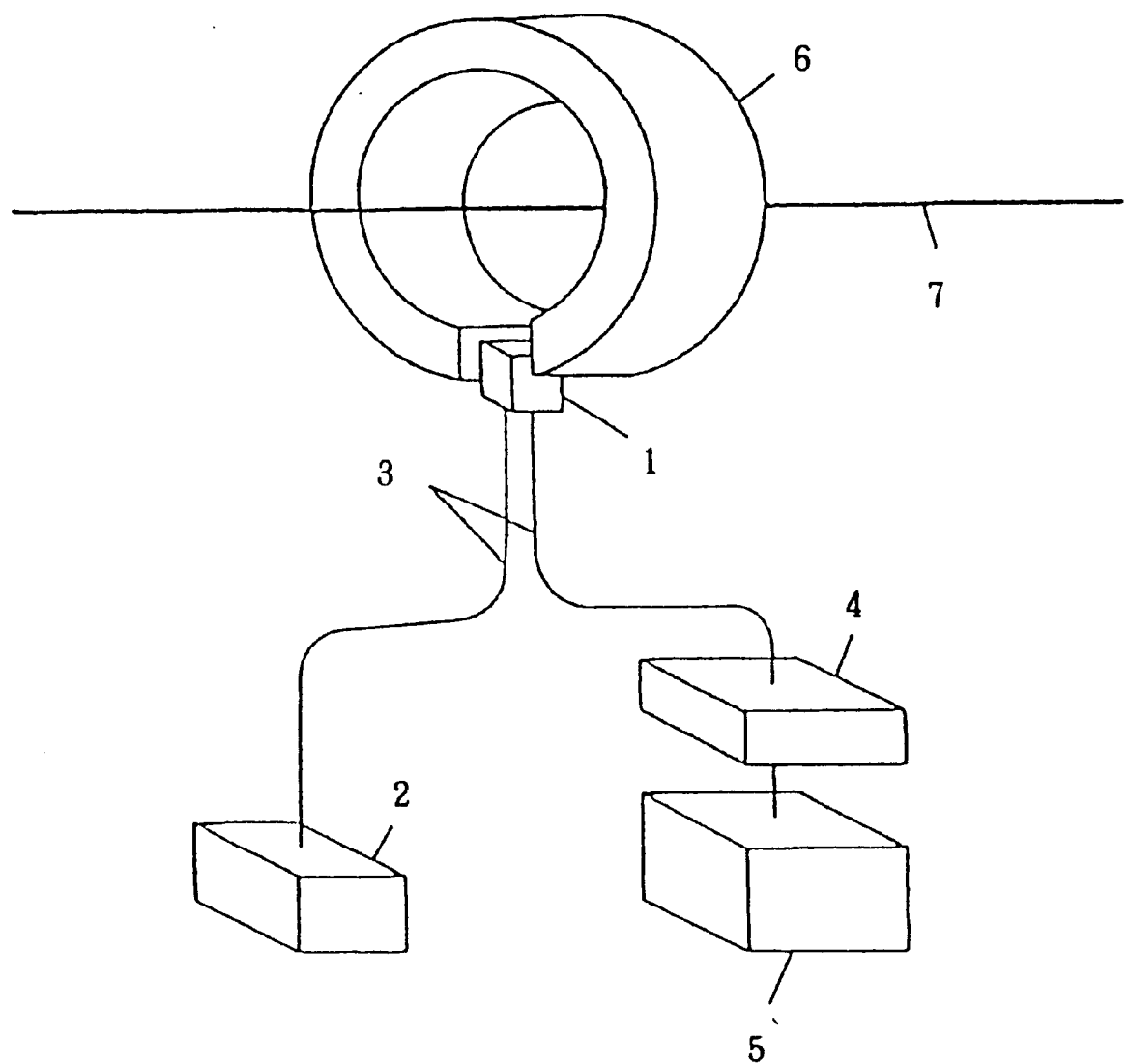
FIG. 1 is a schematic view of magnetic field measuring equipment using an optical magnetic field sensor according to the present invention.

FIG. 1 shows an embodiment of magnetic field measuring equipment using a magneto-optical element and an optical magnetic field sensor according to the present invention. An optical magnetic field sensor 1 is arranged under a magnetic field to be measured or in the gap of a core 6 as shown in FIG. 1. In FIG. 1, the numeral 3 indicates an optical fiber forming an optical transmission path. The numeral 2 indicates optical signal generation means using an LED having a 0.8 μm wavelength band, or an LD having a 0.3 μm wavelength band or a 1.5 μm band. The numeral 4 indicates detection means for detecting a light having passed through the optical magnetic field sensor 1 to convert the light to an electrical signal, which usually employs Ge-PD, Si PIN-PD or the like, but this time employs Si PIN-PD because it uses the LED having a wavelength 0.8 μm band. The numeral 5 indicates a signal processing circuit; and the numeral 7 indicates an electrical wire to be measured.

Figure 2:
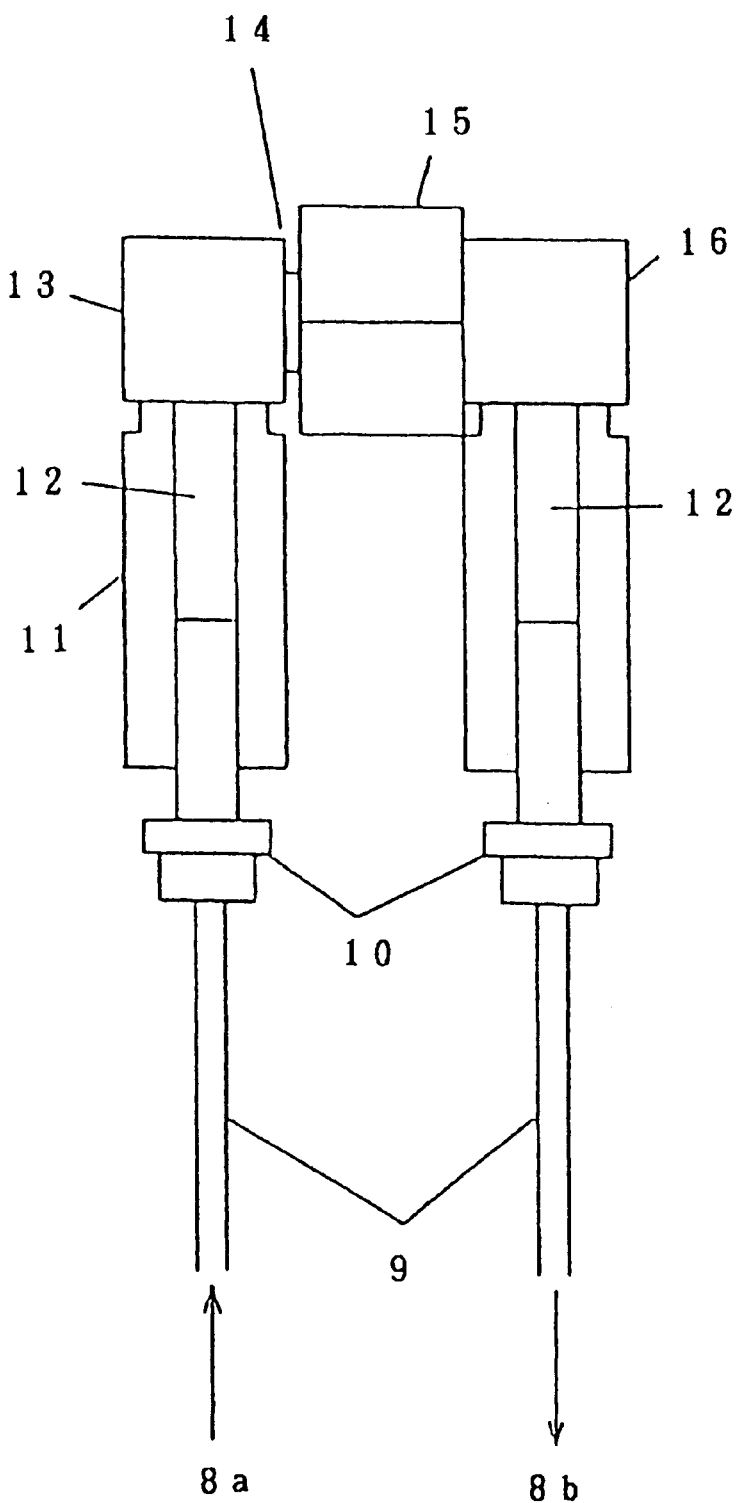
FIG. 2 is a block diagram of a conventional optical magnetic field sensor.
Figure 3:
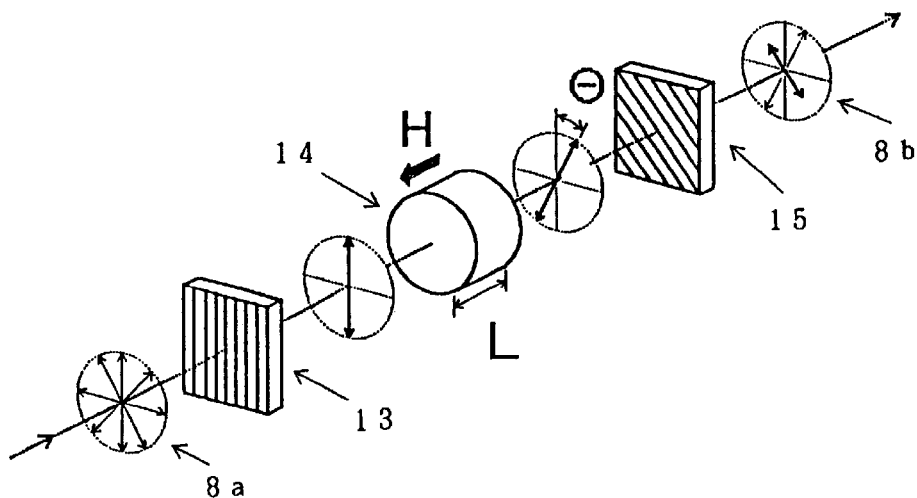
FIG. 3 is a typical view showing the measuring principle of a magnetic field using the Faraday effect.

The optical magnetic field sensor 1 is conventionally composed as shown in FIG. 2, in which the polarizer 13 provided on one end face of the magneto-optical element 14 and the analyzer 15 provided on the other end face are installed in such a manner that their transmission-polarization directions are crossed 45 degrees to each other. The angle, even if it deviates somewhat from 45 degrees, will not significantly affect the linearity properties of the sensor. The polarizer 13 and the analyzer 15 often employ polarization beam splitters. The numeral 12 indicates a lens for turning a light radiated to the magneto-optical element to a collimated light, or for turning a light having transmitted the magneto-optical element to a converged light.

First, an embodiment of an improved composition of the magneto-optical element will be explained.

Using a $Bi_2O_3$—$PbO$—$B_2O_5$, based flux, the Bi-substituted rare-earth iron garnet crystal expressed by a general formula (formula 1) was caused to be crystallizedly grown on a Ca—Mg—Zr-substituted $Gd_3Ga_5O_{12}$ substrate with the LPE method. Table 1 shows the embodiment. The numerical values indicate the composition ratio for each element. Table 1 also shows the results of the measurement of the linearity error within a magnetic field range 0 Oe to 200 Oe, with the magneto-optical elements thus produced used for the optical magnetic field sensor of FIG. 2. The frequency of the alternating current magnetic field is 60 Hz. The samples of the linearity properties marked with # in Table 1 are beyond the scope of the present invention.

TABLE 1

| | Composition of rare-earth iron garnet crystals | | | | | | Linearity error (%) of sensor output |
|---|---|---|---|---|---|---|---|
| Sample No. | Bi X | Gd Y | La Z | Y 3-X-Y-Z | Fe 5-W | Ga W | (5.0~ 200 Oe) |
| 1 | 0.8 | 0.2 | 0.9 | 1.1 | 4.7 | 0.3 | ≦ ± 1.0% |
| 2 | 0.8 | 0.2 | 0.9 | 1.1 | 4.8 | 0.2 | ≦ ± 0.8% |
| 3 | 0.8 | 0.2 | 0.7 | 1.3 | 4.9 | 0.1 | ≦ ± 0.6% |
| 4 | 1.0 | 0.3 | 0.8 | 0.9 | 4.9 | 0.1 | ≦ ± 0.6% |

TABLE 1-continued

| | Composition of rare-earth iron garnet crystals | | | | | | Linearity error (%) of sensor output |
|---|---|---|---|---|---|---|---|
| Sample No. | Bi X | Gd Y | La Z | Y 3-X-Y-Z | Fe 5-W | Ga W | (5.0~ 200 Oe) |
| *5 | 1.3 | 0.4 | 0.1 | 1.2 | 5.0 | 0.0 | ≦ ± 0.5% |
| 6 | 1.3 | 0.1 | 0.1 | 1.5 | 4.6 | 0.4 | # ≦ ± 1.5% |
| 7 | 1.3 | 0.1 | 0.1 | 1.5 | 4.4 | 0.6 | # ≦ ± 2.0% |

Figure 4:
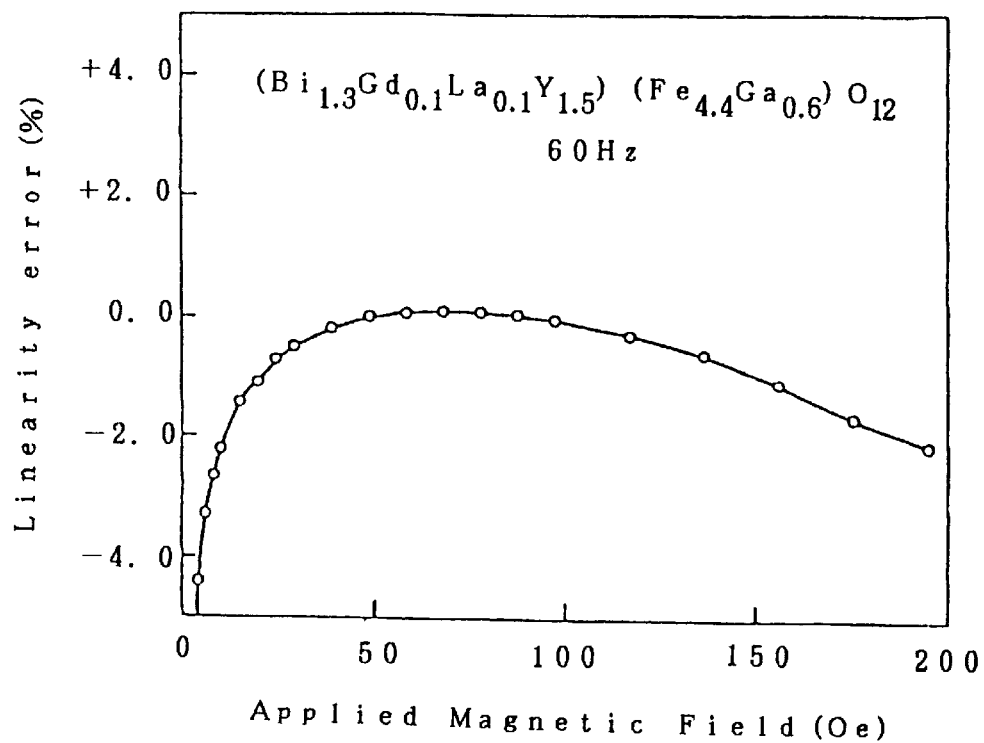
FIG. 4 is a graph showing the linearity error of the output of a magnetic field measuring equipment using a conventional magneto-optical element.
Figure 5:
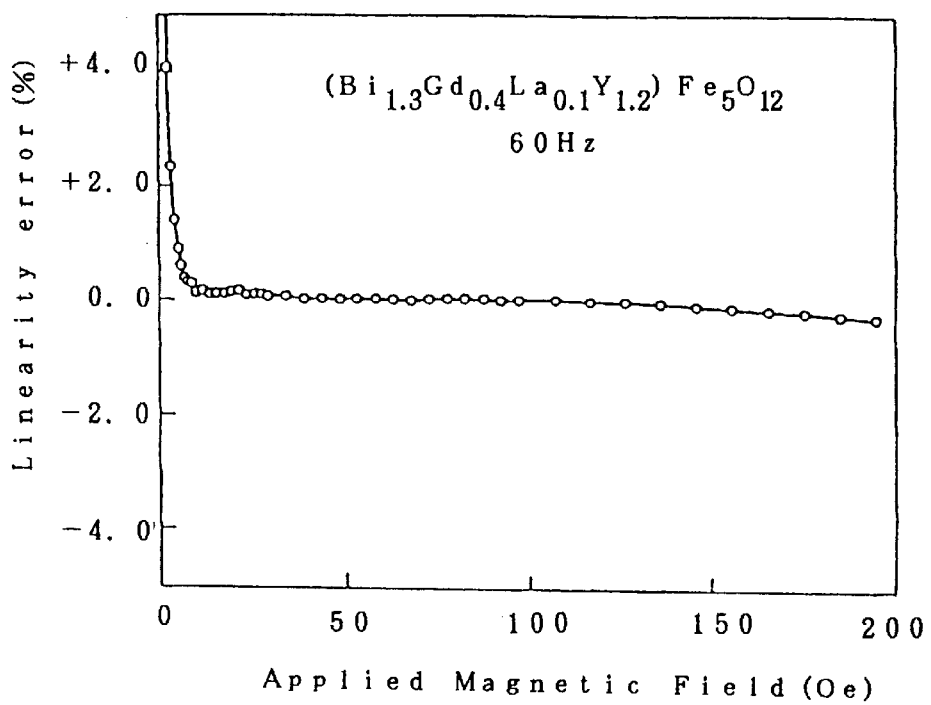
FIG. 5 is a graph showing the linearity error of the output of magnetic field measuring equipment using a magneto-optical element according to the present invention.

For the No. 5 sample marked with * in Table 1, measured data of the linearity with respect to the magnetic field is shown in FIG. 5. Although the magneto-optical element of the present invention is expressed by a general formula (formula 1), where its crystal composition range is such that the value of X is set at $0.8 \leq X \leq 1.3$; that of Y at $0.2 \leq Y \leq 0.4$; that of Z at $0.1 \leq Z \leq 0.9$; and that of W at $0 \leq Z \leq 0.3$; the linearity error is ±1.0% or less within a magnetic field range of 5.0 Oe to 200 Oe. It will be well understood that, as compared with the prior art example of FIG. 4, the linearity is improved.

For the No. 5 sample in Table 1 and the above-mentioned prior art example, the results of the measurement of the magnetic field Hs required to magnetically saturate the magneto-optical element at room temperature are shown in Table 2:

TABLE 2

| | | Hs (Oe) |
|---|---|---|
| Prior art example | $(BiGdLaY)_3(FeGa)_5O_{12}$ | 720 |
| Present embodiment | $(BiGdLaY)_3Fe_5O_{12}$ | 1450 |

These results show that the ferrimagnetic rare-earth iron garnet crystal in which a non-magnetic element is not substituted for the Fe element, compared with that in which the non-magnetic element is otherwise, has a higher Hs and a smaller coefficient B shown in equation 3, thereby improving the linearity with respect to the magnetic field. Although the embodiment of the present invention has described the alternating current magnetic field, for the direct current magnetic field, a similar consideration may be made such that for the optical magnetic field sensor having the composition as shown in FIG. 2, the larger Hs the magneto-optical element employs, the more the linearity with respect to the magnetic field is improved.

[Embodiment 2]

The magneto-optical elements of Table 1 shown are those in which the Gd element has been substituted in order to consider also the temperature properties. Therefore, with these magneto-optical elements used for the magnetic field measuring equipment, a temperature variation in their outputs was evaluated within a temperature range of −20° C. to +80° C., with the results that the linearity error is ±1.0% or less for all magneto-optical elements. On the other hand, where the temperature properties are not considered, the magneto-optical element, shown by a general formula (chemical formula 2) in which the Gd element is not substituted, may also be used as an element having good linearity for the magnetic field measuring equipment.

$(Bi_XR_YY_{3-X-Y})Fe_5O_{12}$ (formula 2)

Where magneto-optical element expressed by a general formula (chemical formula 2) is produced, and used to compose a magnetic field measuring equipment as shown in FIG. 1, the measured results of the linearity error are shown in Table 3. The numerical values indicate the composition ratio for each element.

TABLE 3

| Sample No. | Composition of garnet crystal | | | Linearity error (%) of sensor output (5.0~200 Oe) |
|---|---|---|---|---|
| | Bi X | La Y | Y 3-X-Y | |
| 1 | 0.6 | 0.2 | 2.2 | ≦ ± 1.0% |
| 2 | 0.8 | 0.2 | 2.0 | ≦ ± 1.0% |
| 3 | 1.0 | 0.1 | 1.9 | ≦ ± 1.0% |
| *4 | 1.3 | 0.1 | 1.6 | ≦ ± 1.0% |

Figure 6:
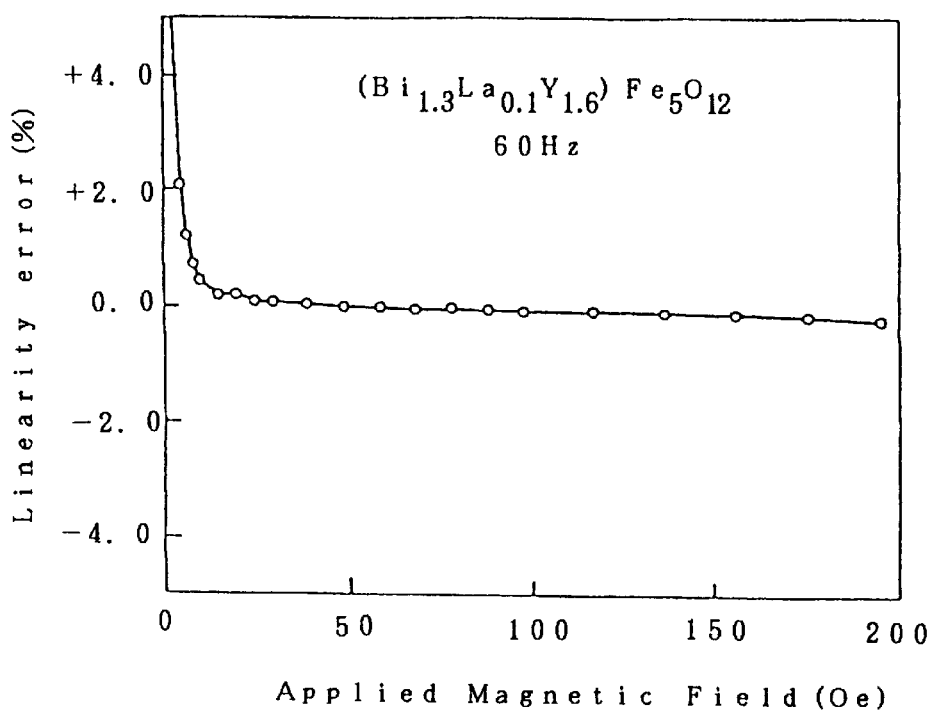
FIG. 6 is a graph showing the linearity error of the output of magnetic field measuring equipment using a magneto-optical element according to the present invention.

For the No. 4 sample marked with * in Table 3, measured data of the linearity with respect to the magnetic field is shown in FIG. 6. Although the magneto-optical element of the present invention is expressed by a general formula (formula 1), where its crystal composition range is such that the value of X is set at $0.6 \leq X \leq 1.3$; and that of Y at $0.1 \leq Y \leq 0.2$, the linearity error is ±1.0% or less within the magnetic field range 5.0 Oe to 200 Oe, so that the temperature properties are not good, but the linearity error with respect to the magnetic field indicates sufficiently usable properties.

Although the present embodiment has described an example using La as a substituting element in order to obtain a lattice matching, one or more kinds of rare-earth elements could also have been used for the R elements in a general formula ((formula 1) or (formula 2)). In that case, good results are obtained by the use of a non-magnetic element which does not affect the saturation magnetization of the Bi-substituted rare-earth iron garnet crystal. Even where those other than a Ca—Mg—Zr-substituted $Gd_3Ga_5O_{12}$ crystal substrate having different lattice constants were used for a garnet crystal substrate, one or more kinds of rare-earth elements were substituted for the R elements in a general formula ((formula 1) or (formula 2)) to obtain a lattice matching, whereby a Bi-substituted rare-earth iron garnet crystal having a good linearity could be grown. Further, in order to compensate the temperature properties, several element such as Tb, Dy, Ho, Er and Tm, also were confirmed to be effective.

Although in the above case, a magneto-optical element was caused to be grown on a Ca—Mg—Zr-substituted $Gd_3Ga_5O_{12}$ crystalline substrate, the element was caused to be grown also on a $Nd_3Ga_5O_{12}$ substrate by changing the growth conditions, whereby similar results were obtained. By the use of the chemical vapor deposition method, the element may be caused to be epitaxially grown on these substrates. However, although a magneto-optical element which is expressed by a general formula (formula 1), and whose crystal composition range is such that the value of X is set at $0.8 \leq X \leq 1.3$; that of Y at $0.2 \leq Y \leq 0.4$; that of Z at $0.1 \leq Z \leq 0.9$; and that of W at $0 \leq W \leq 0.3$; and a magneto-optical element which is expressed by a general formula (formula 2), and whose crystal composition range is such that the value of X is set at $0.6 \leq X \leq 1.3$; and that of Y at $0.1 \leq Y \leq 0.2$ may be formed as a polycrystal line substance without being epitaxially grown depending on growth conditions in either of the growth methods, even such magneto-optical element as a polycrystal line substance has a somewhat-increased light absorption loss, but may be sufficiently usable.

An embodiment in which the linearity was improved by an optical system of an optical magnetic field sensor will be explained hereinafter.

[Embodiment 3]

Figure 7:
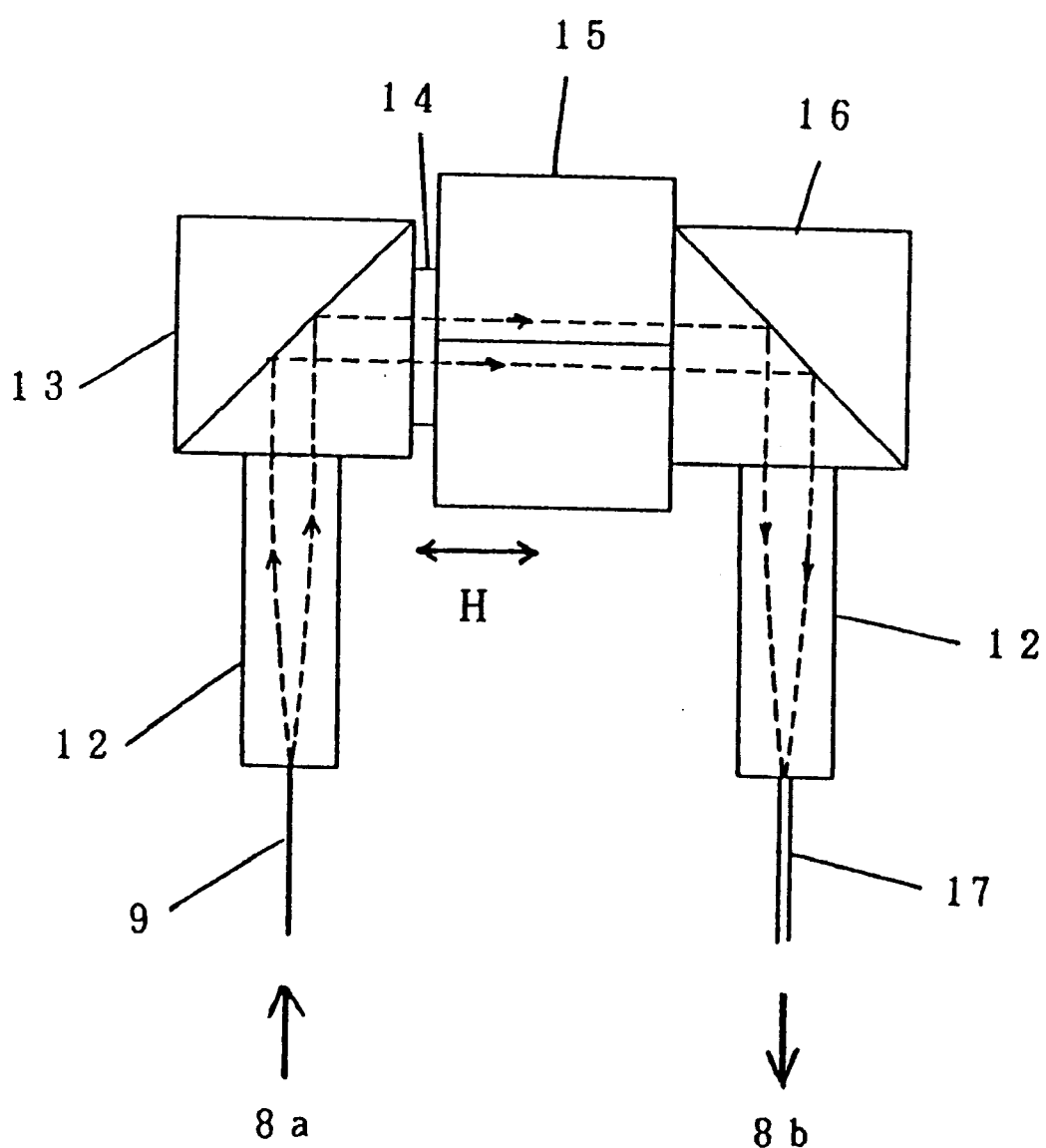
FIG. 7 is a block diagram of an optical magnetic field sensor according to the present invention.

FIG. 7 is a block diagram showing an optical magnetic field sensor according to the present invention. In FIG. 7, the optical fiber 9 on the light radiated side employs multi mode fibers having an optical fiber core diameter of 50 μm, while an optical fiber 17 on the light emitted side employs multi mode fibers having an optical fiber core diameter of 200 μm. The lenses on the light radiated and emitted sides are self-focussing rod lenses having a pitch of 0.25. The polarizer 13 and the analyzer 15 are arranged on the opposing faces of the rare-earth iron garnet crystal in such a manner that their transmission-polarization directions are crossed 45 degrees to each other. The full-reflecting mirror 18 is used to bend an optical path by 90 degrees.

Figure 14:
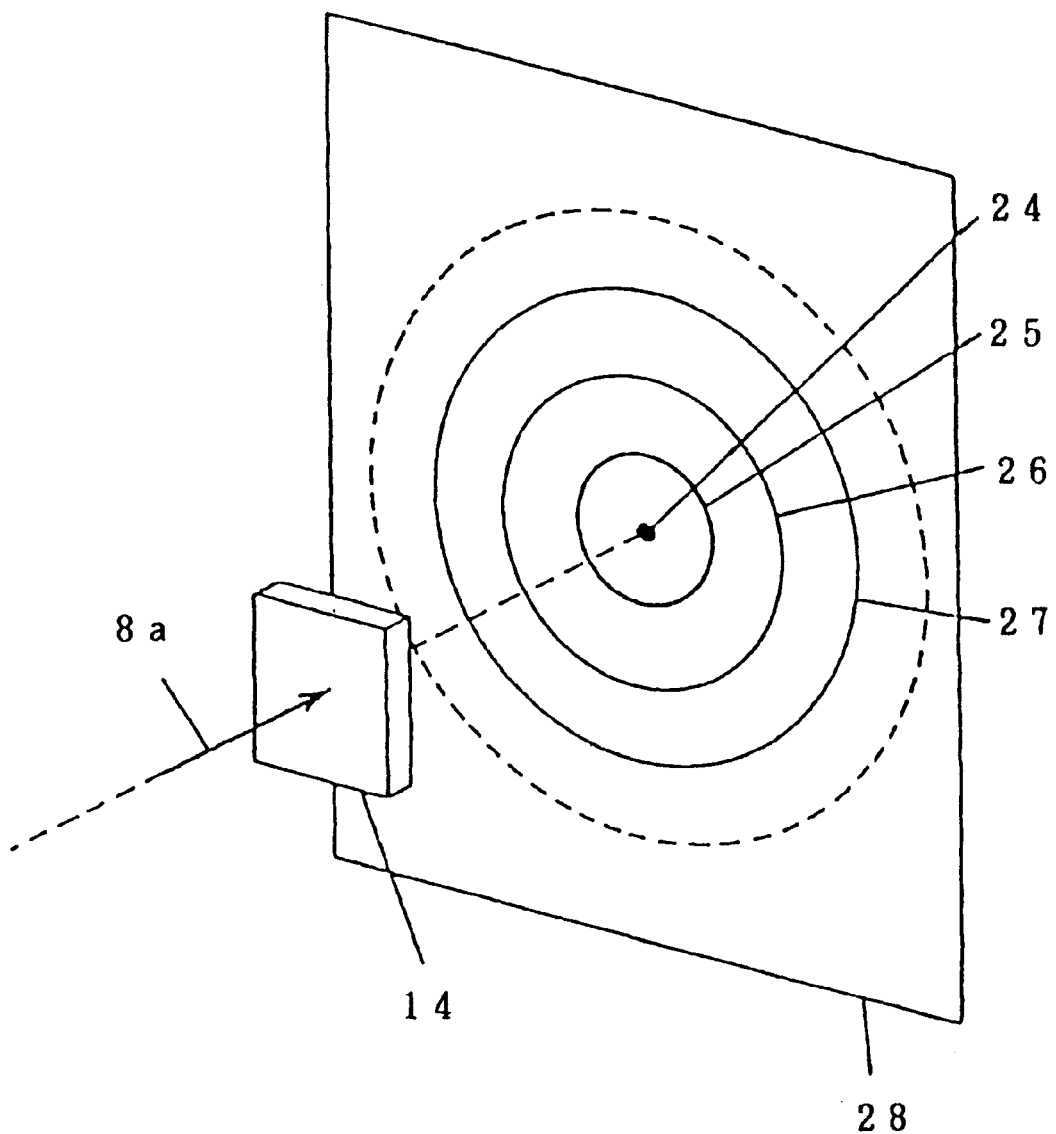
FIG. 14 is a typical view to help explain a light diffraction phenomenon due to a ferrimagnetic garnet crystal.

The light 8a radiated from a light source passes through the optical fiber 9, is turned by the lens 12 to a collimated light, then turned by the polarizer 13 to a linearly polarized light, and then the light 8a thus reflected is radiated to the magneto-optical element 14. At this point, the beam diameter of the light radiated to the magneto-optical element 14 is 800 μm. The light having been radiated to the magneto-optical element 14 is diffracted by the magneto-optical element 14 having a multi-magnetic domain structure, as shown in FIG. 14, propagates while diverging, is light-detected only for the 45-degree component with respect to the polarizer 13 by the analyzer 15, and then bent by 90 degrees in the propagating direction by the full-reflecting mirror 16. The light bent by 90 degrees in the propagating direction is radiated to the lens 12 to be converged on an optical fiber 17 on the light output side. Since the rare-earth iron garnet crystal employs the $(BiGdLaY)_3(FeGa)_5O_{12}$ crystal, the diffraction angle θ per one order of diffracted light for wavelength 880 μm is 2.6 degrees.

As shown in the present embodiment, where the multi-mode fibers having a core diameter of 200 μm larger than the core diameter of 50 μm of the optical fiber 9 on the light input side are used for the optical fiber 17 on the light output side, the numerical aperture of the optical system on the light output side becomes larger than the numerical aperture of the optical system on the light input side. Therefore, where the optical fiber having the same core diameter is used for the optical fiber 9 to compose the optical magnetic field sensor as shown in FIG. 2 of the prior art example, only the zero-order light has been detected, while in the present embodiment, the order number of the diffracted light which the lens 12 on the light output side can detect has become large, thereby making it possible to detect a light having an order number greater than zero.

[Embodiment 4]

Figure 8:
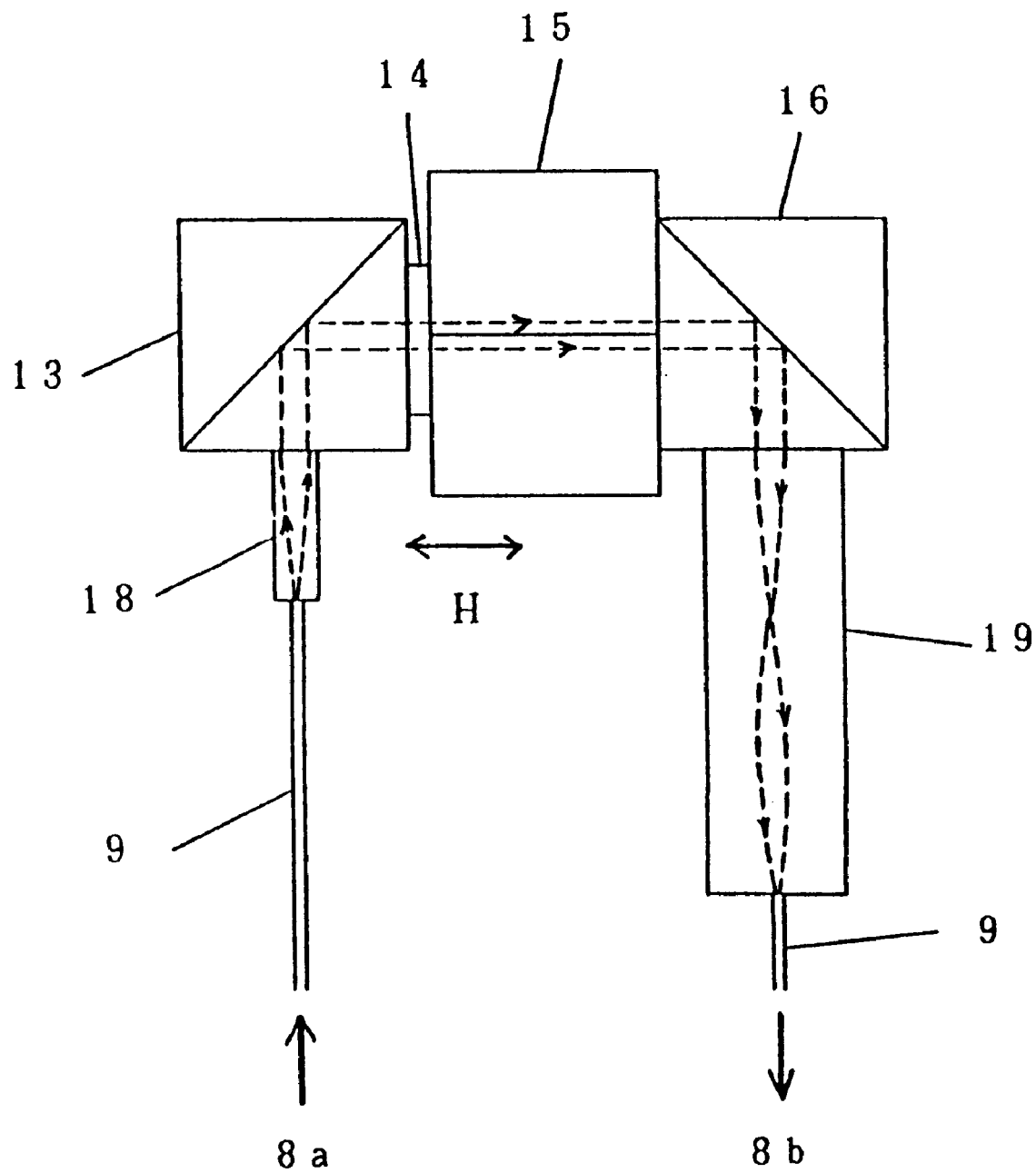
FIG. 8 is a block diagram of an optical magnetic field sensor according to the present invention.

A fourth embodiment is shown in FIG. 8. The point where the optical magnetic field sensor of FIG. 8 is different from the prior art example shown in FIG. 2 exists in that self-focussing rod lenses having a diameter of 1 mm and a pitch of 0.25 are arranged on a lens 18 on the light input side, and self-focussing rod lenses having a diameter of 3 mm and 5 mm, and a pitch of 0.25 are arranged on a lens 19 on the light output side.

As shown in the present embodiment, where the lens 19 on the light output side employs lenses having a larger diameter than that of lenses for the lens 18 on the light input side, similarly to the third embodiment, the numerical aperture of the optical system on the light output side becomes larger than the numerical aperture of the optical system on the light input side. Therefore, where the self-focussing rod lenses having the same core diameter and a pitch of 0.25 are used for the lenses on the light input and output sides to compose the optical magnetic field sensor as shown in FIG. 2 of the prior art example, only the zero-order light has been detected, while in the fourth embodiment, the order number of the diffracted light which the lens 19 on the light output side can detect has become large, thereby making it possible to detect a light having an order number greater than zero.

The same effect has also been found where an aspherical lens and a spherical lens capable of obtaining a collimated light are used instead of the self-focussing rod lenses 18, 19 of FIG. 8 so that the diameter of the lens on the light output side is made larger than that of the lens on the light input side.

[Embodiment 5]

Figure 9:
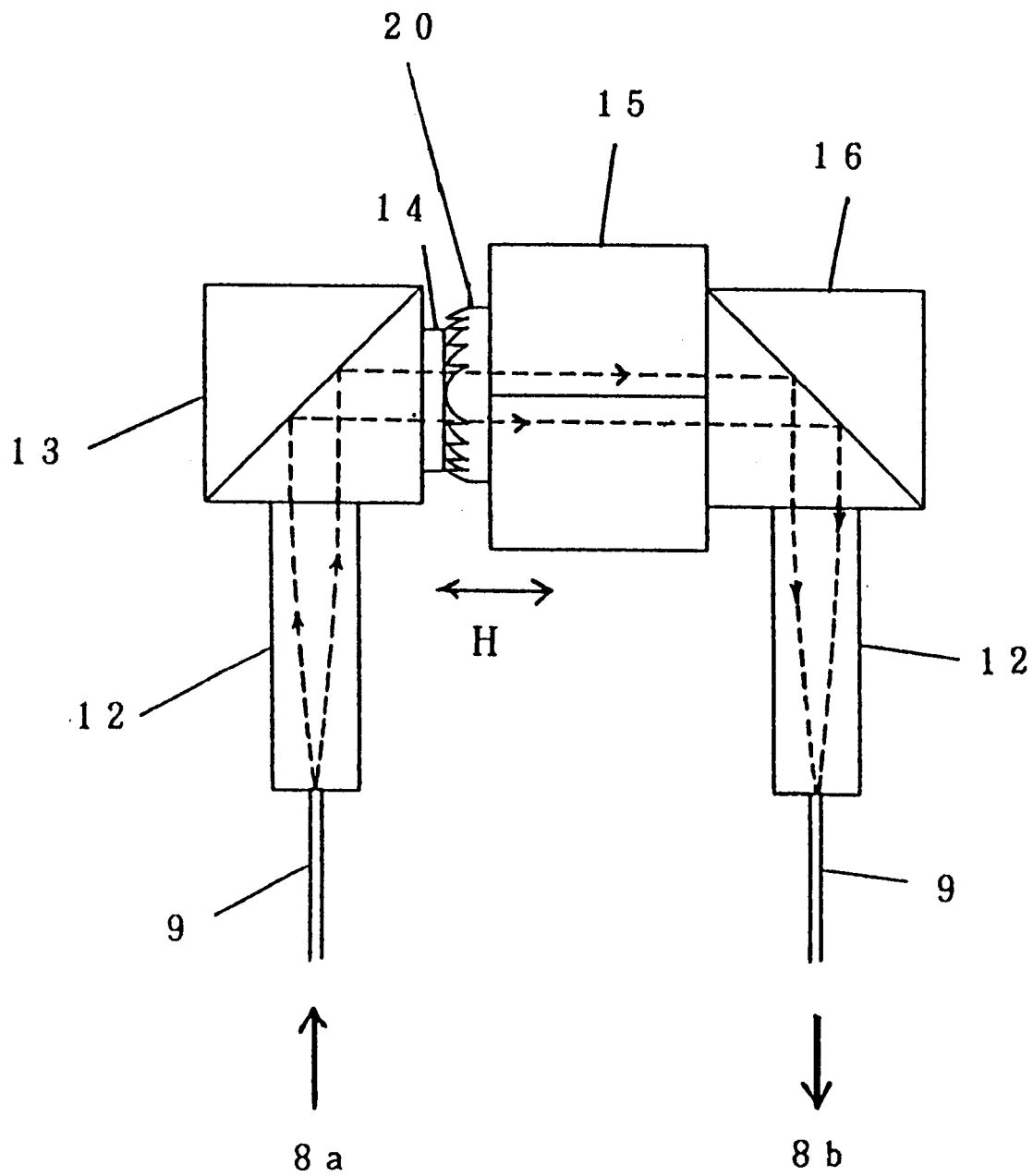
FIG. 9 is a block diagram of an optical magnetic field sensor according to the present invention.

A fifth embodiment is shown in FIG. 9. The point where the optical magnetic field sensor of FIG. 9 is different from the prior art example shown in FIG. 2 exists in that in the optical magnetic field sensor of the prior art example, a Fresnel lens 20 is arranged on the plane opposite to the polarizer 13 with respect to the magneto-optical element 14 on the optical path in the direction shown in FIG. 9. The Fresnel lens employs lenses having a diameter of 3 mm and a numerical aperture of 0.3. Therefore, the total zone number of the Fresnel lens used for the wave length 880 nm is in fact about $2.56 \times 10^5$.

As shown in the present embodiment, where the Fresnel lens 20 is arranged directly behind the magneto-optical element 14 with respect to the light propagating direction so as to turn the diverging light to a collimated light, the light diffracted by the magneto-optical element 14 can be efficiently turned to a collimated light. Therefore, where the optical magnetic field sensor is composed as shown in FIG. 2 of the prior art example, only the zero-order light has been detected, while in the fifth embodiment, the order number of the diffracted light which the lens 12 on the light output side can detect has become large, thereby making it possible to detect a light having an order number greater than zero.

The Fresnel lens 20 has an advantage in that the lens is thinner in lens thickness than that of a flat convex lens, so that when the optical magnetic field sensor is housed in a case, the external shape of the sensor is not large. The same effect has been found when a grating lens is used instead of the Fresnel lens.

[Embodiment 6]

Figure 10:
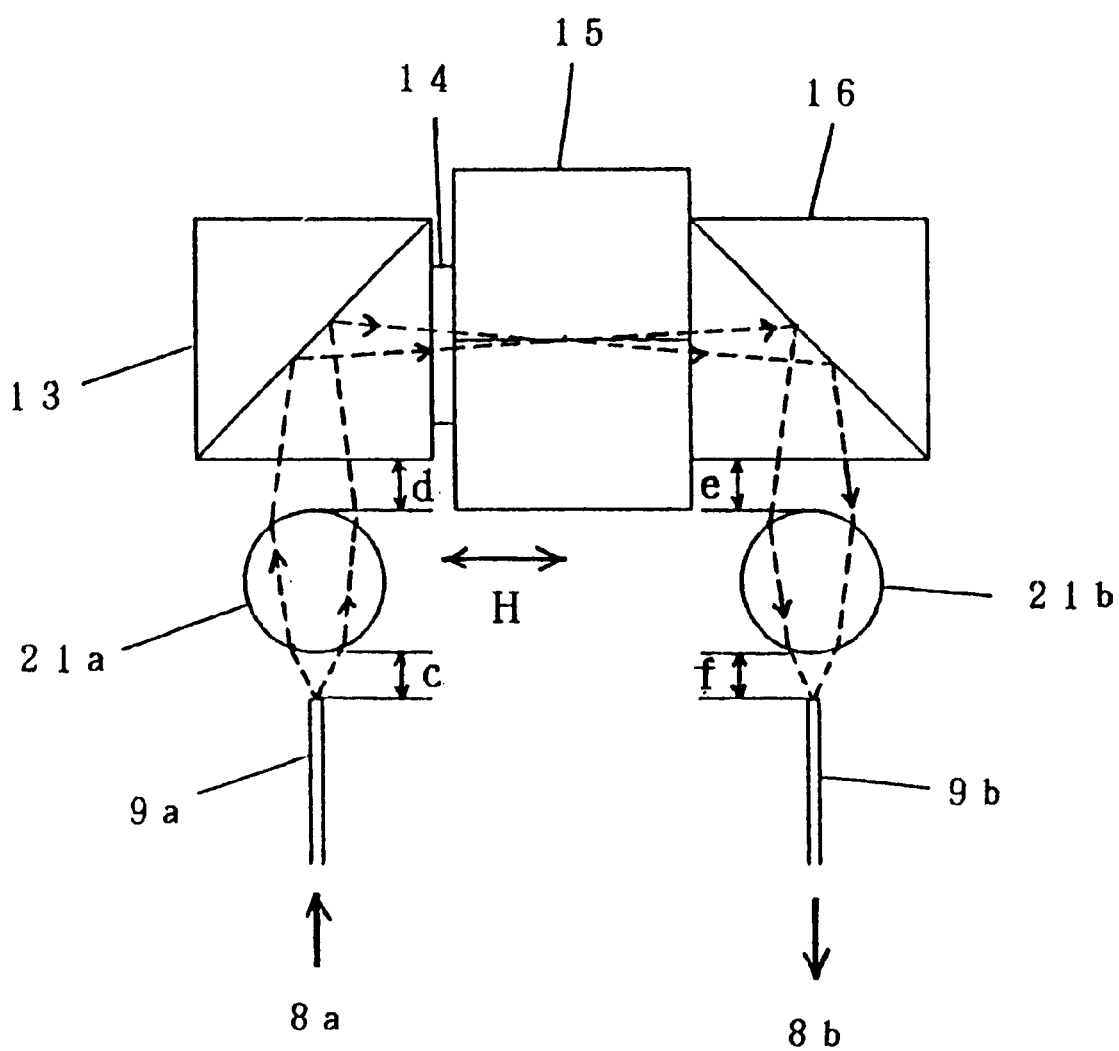
FIG. 10 is a block diagram of an optical magnetic field sensor according to the present invention.

A sixth embodiment is shown in FIG. 10. The point where the optical magnetic field sensor of FIG. 10 is different from the prior art example shown in FIG. 2 exists in that spherical lenses 21 having a diameter of 3 mm are arranged on the light input and output sides to compose a light-converging optical system. Now, when the light-converging optical system is to be composed, care must be taken to allow a distance c between an optical fiber 9a on the light input side and a lens 21a on the light input side, a distance d between the lens 21a on the light input side and the polarizer 13, a distance e between the full-reflecting mirror 16 and a lens 21b on the light output side, and a distance f between the lens 21b on the light output side and an optical fiber 9b on the light output side, on the optical path. In the present embodiment, all the respective distances have been designed to be 1 mm to 1.4 mm. Meanwhile, the values of the diameter of the spherical lenses and distances, c, d, e, and f are selected in a manner that the optical insertion loss is made minimum. Now in that case, the polarizer, the light detector and the full-reflecting mirror are cubes whose side each is 5 mm. Where the material of the spherical lens employs BK7, and the light-source wavelength is 880 nm, the beam diameter of a light at a crystal position is 480 μm. Where a light-converging optical system is composed as shown in the present embodiment, the crystal position is located near a beam waist, so that the beam diameter of a light at the crystal position has become smaller than that with the prior art. As a result, the lens 21b on the light output side has made it possible to detect a light having an order number greater than zero.

[Embodiment 7]

Figure 11:
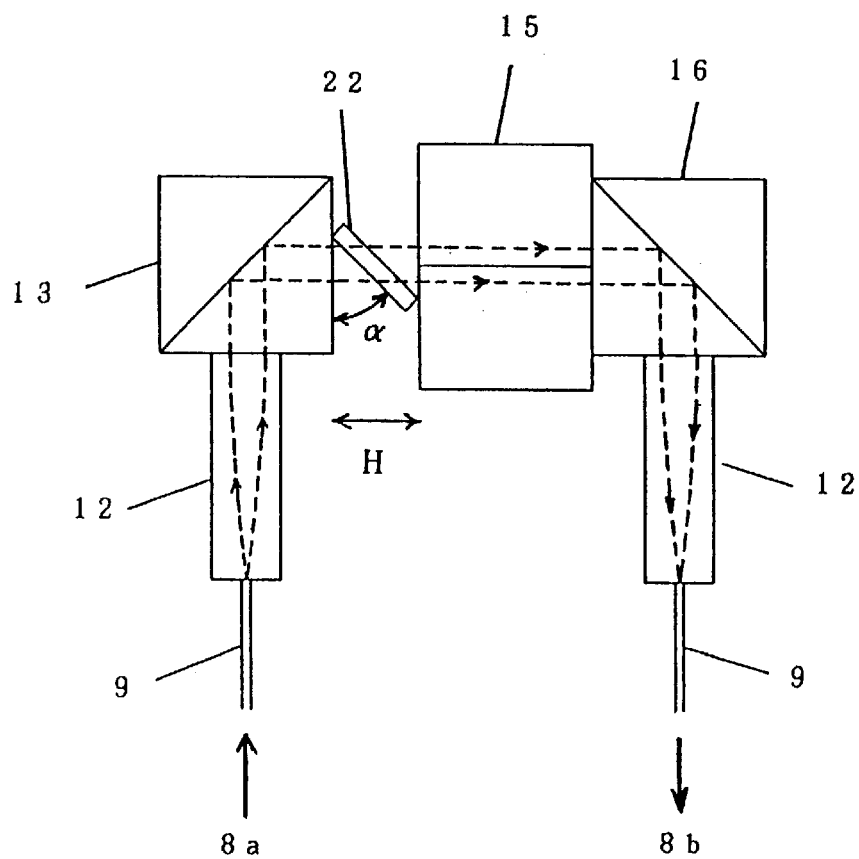
FIG. 11 is a block diagram of an optical magnetic field sensor according to the present invention.

A seventh embodiment is shown in FIG. 11. The point where the optical magnetic field sensor of FIG. 11 is different from the prior art example shown in FIG. 2 exists in that a magneto-optical element 22 is arranged in a manner to be inclined by an angle α to the light propagating direction. The arrangement of the magneto-optical element 22 so as to be inclined to the light propagating direction allows the diffraction effect developing in the magneto-optical element to be reduced.

The rare-earth iron garnet crystal being a ferrimagnetic substance has a multi-magnetic domain structure, so that the crystal becomes a diffraction grit with respect to light. Generally, when the light incident angle to the diffraction grit is caused to be increased from zero degrees, the diffraction effect of the diffraction grit is reduced extremely. Therefore, the magneto-optical element 22 is caused to be inclined to the light propagating direction of the incident beam as shown in the present embodiment, thereby allowing the diffraction effect of the magneto-optical element to be reduced and a measuring accuracy to be improved. In the present embodiment, from the sensor sensitivity and the light insertion loss points of view, the inclined angle α has been made an optimum value of 45 degrees.

[Embodiment 8]

Figure 12:
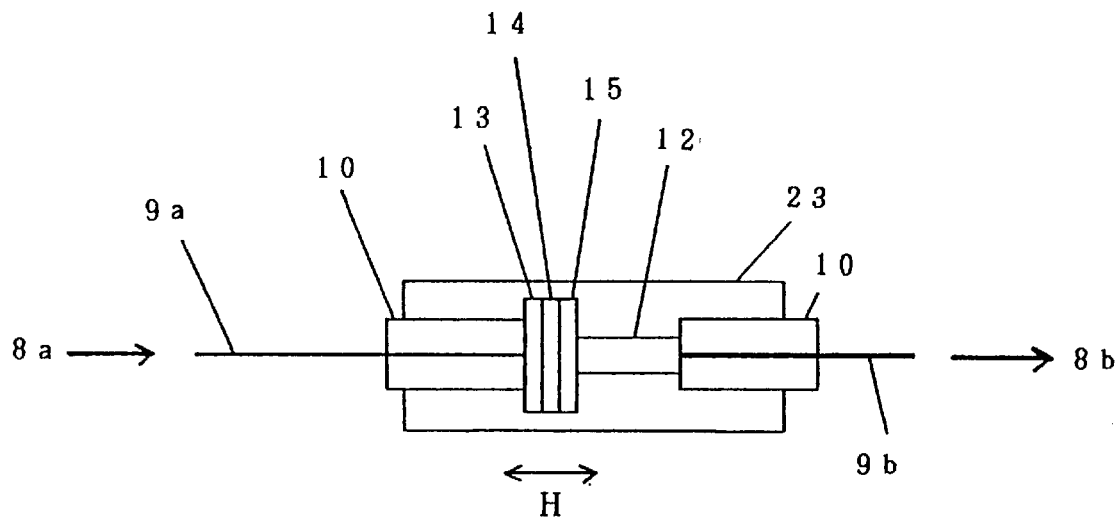
FIG. 12 is a block diagram of an optical magnetic field sensor according to the present invention.

A eighth embodiment is shown in FIG. 12. FIG. 12 shows a linear optical magnetic field sensor, in which the optical fiber 9a on the light input side is a multi-mode fiber having a core diameter of 200 μm. The polarizer 13 and the analyzer 15 are laminated polarizer thin-films, and installed on both faces of the magneto-optical element 14 in such a manner that their transmission-polarization directions are crossed 45 degrees to each other. The magneto-optical element 14, the polarizer 13 and the analyzer 15 used are 3×3 mm square in size. The numeral 12 indicates a lens, and the optical fiber 9b on the light output side is a multi-mode fiber having a core diameter of 400 μm. The numeral 10 indicates a ferrule to fix fibers. These components are housed in a case 23. The optical magnetic field sensor shown in FIG. 12 comprises, in combination, the above-mentioned embodiments 3 through 7.

If a transmitted light can be converged on the end face of the optical fiber on the light output side, the lens 12 may employ a concave lens or the like. There the core diameter of the optical fiber on the light output side is larger than that of the optical fiber on the light input side, a composition in which the lens 12 is not arranged has been realized.

Then, in order to evaluate the optical magnetic field sensors of FIGS. 7 through 12, a current measuring equipment is composed as shown in FIG. 1 to measure the linearity error. The optical magnetic field sensor 1 is installed directly to the electric wire or arranged in the gap of the core as shown in FIG. 1.

Table 4 includes the results which illustrate that using an optical magnetic field sensor for the current measuring equipment composed as described above, the linearity error was measured within a magnetic field range 0 Oe to 200 Oe. The frequency of the alternating current used is 60 Hz.

Compared with the measured data of the prior art examples, it will be understood from the results that the linearity is improved by these optical system compositions. Therefore, the composition of the optical magnetic field sensor in these optical systems has allowed a diffracted light having an order number greater than zero to be detected, the signal intensity of a second higher harmonic included in the output to be reduced, and the linearity of the optical magnetic field sensor with respect to a magnetic field to be significantly improved.

TABLE 4

|  | Linearity error (%) (5.0~200 Oe) |
|---|---|
| Prior art example | $\leq \pm 2.0$ |
| Embodiment 3 | $\leq \pm 1.0$ |
| Embodiment 4 | $\leq \pm 1.0$ |
| Embodiment 5 | $\leq \pm 1.5$ |
| Embodiment 6 | $\leq \pm 1.5$ |
| Embodiment 7 | $\leq \pm 1.0$ |
| Embodiment 8 | $\leq \pm 1.0$ |

Therefore, when using the optical magnetic field sensor according to the optical system of the present invention, current measuring equipment and, an optical CT can be composed which has a ratio error of ±1% or less within a current measurement range of 0.025 I to I with respect to a rated current value I.

Although in the optical magnetic field sensor of the present embodiment, the polarizer 13 and the analyzer 15 have been made polarization beam splitters, they may employ a glass-made polarized plate or a laminated polarizer thin-film. Particularly, an optical magnetic field sensor in which a glass-made polarized plate or a laminated polarizer thin-film is used for the polarizer 13 and the analyzer 15 has a big advantage of allowing miniaturization. Also, a lens capable of obtaining a collimated light can be substituted for the self-focussing rod lens. Further, a linear optical magnetic field sensor has been composed without using the full-reflecting mirror.

Figure 13:
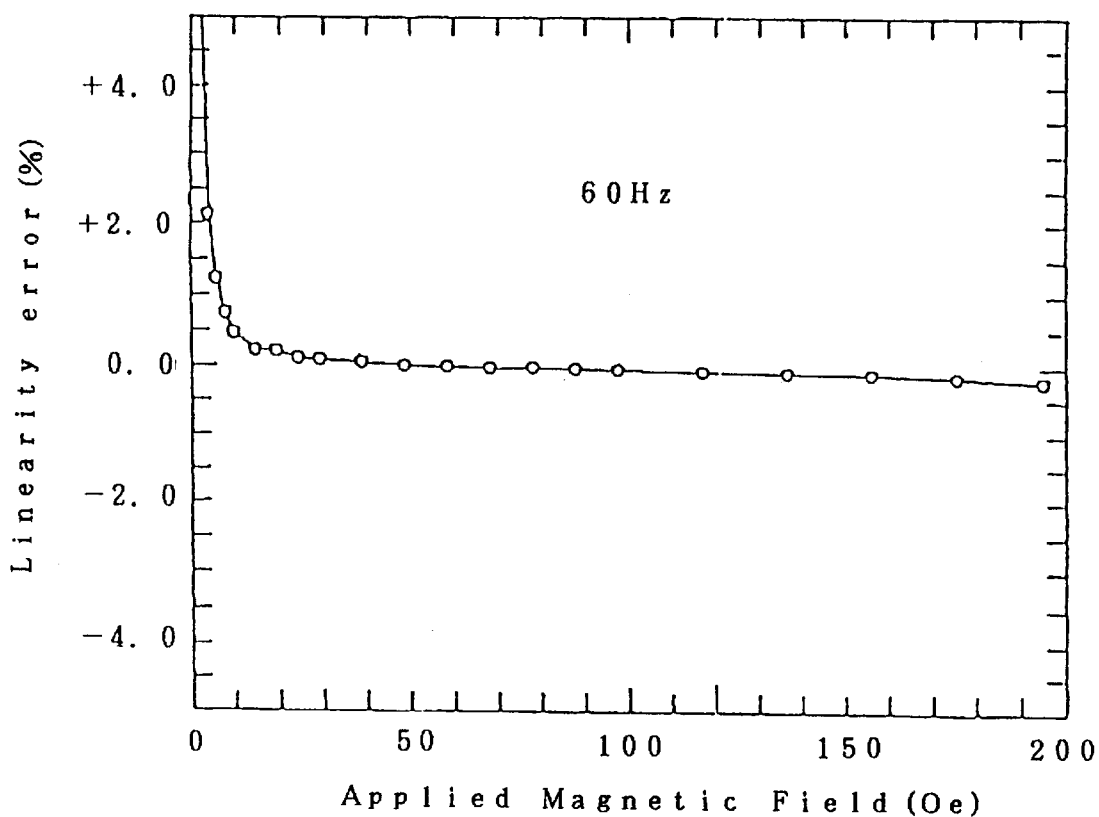
FIG. 13 is a graph showing the linearity error of the output of magnetic field measuring equipment using a magneto-optical element and an optical magnetic field sensor according to the present invention.

The improvement in linearity has been found not only for a light source having a 0.8 $\mu$m band, but also for other wavelengths of 1.3 $\mu$m and 1.5 $\mu$m passing through the rare-earth iron garnet crystal. It has also been confirmed that a magnetic field can be measured with good linearity not only for a frequency of 60 Hz, but also for a range corresponding to a direct current magnetic field to about several-hundred KHz. Although there have been shown examples of optical magnetic field sensors in which the rare-earth iron garnet crystal expressed by (formula 1) was used in order to consider the temperature properties of the optical magnetic field sensors, the composition of the optical system of the present embodiment can be applied to all optical magnetic field sensors in which the garnet crystal being a ferrimagnetic substance is used for a magneto-optical element; and also an optical magnetic field sensor can comprise, in combination, these embodiments. FIG. 13 shows the results of the linearity error for a magnetic field measuring equipment composed in such a manner that a magneto-optical element expressed by (formula 1) is used for the optical magnetic field sensor using the light-collecting optical system of embodiment 6. It will be understood from FIG. 13 that the linearity is obviously improved by the crystal composition and the optical system.

What is claimed is:

1. An optical magnetic field sensor comprising:
   a polarizer;
   a magneto-optical element;
   an analyzer;
   a first lens provided across said polarizer at an end of said magneto-optical element; and
   a second lens provided across said analyzer at another end of said magneto-optical element,
   wherein
   a transmission-polarization direction of said analyzer is different from a transmission-polarization direction of said polarizer,
   said polarizer, magneto-optical element, and analyzer are arranged along at least a light propagating direction to detect as an output light intensity a magnetic field to be measured, and
   a lens diameter of the second lens is larger than a lens diameter of the first lens.

2. An optical magnetic field sensor in accordance with claim 1, wherein
   the magneto-optical element is formed of a ferrimagnetic rare-earth iron garnet crystal.

3. The optical magnetic field sensor according to claim 1, wherein said second lens detects light from said analyzer having an order number greater than zero.

4. A magnetic field measuring equipment comprising:
   the optical magnetic field sensor in accordance with the claim 1;
   a first optical transmission path which is provided across said polarizer at an end of said magneto-optical element;
   light generation means for radiating a light into said first optical transmission path;
   a second optical transmission path which is provided across said analyzer at the other end of said magneto-optical element;
   light detection means for detecting an optical output from said second optical transmission path to convert the output to an electrical signal; and
   a signal process section for processing the electrical signal from said light detection means, wherein
   at least the magneto-optical element is arranged in a magnetic field, said signal process section detects a change in output light intensity developed by a transmission of said radiated light through said magneto-optical element, whereby a magnetic field intensity can be measured with a good linearity.

5. An optical magnetic field sensor comprising:
   a polarizer;
   a magneto-optical element;
   an analyzer;
   a first lens provided across said polarizer at an end of said magneto-optical element;
   a second lens provided across said analyzer at the other end of said magneto-optical element; and
   a Bi-substituted rare-earth iron garnet crystal expressed by the following general formula (formula 1):

$$(Bi_XGd_YR_ZY_{3-X-Y-Z})(Fe_{5-W}Ga_W)O_{12} \qquad \text{(formula 1)}$$

wherein
   X is $0.8 \leq X \leq 1.3$,
   Y is $0.2 \leq Y \leq 0.4$,
   Z is $0.1 \leq Z \leq 0.9$,
   W is $0.0 \leq W \leq 0.3$, and
   R is at least one kind of element selected from rare-earth elements; and wherein
a transmission-polarization direction of said analyzer is different from a transmission-polarization direction of said polarizer,
said polarizer, magneto-optical element, and analyzer are arranged along at least a light propagating direction to detect as an output light intensity a magnetic field to be measured, and
a lens diameter of the second lens is larger than a lens diameter of the first lens.

* * * * *

UNITED STATES PATENT AND TRADEMARK OFFICE
CERTIFICATE OF CORRECTION

PATENT NO. : 6,232,763 B1
DATED : May 15, 2001
INVENTOR(S) : Nobuki Itoh

It is certified that error appears in the above-identified patent and that said Letters Patent is hereby corrected as shown below:

<u>Title page,</u>
Item [62], the last line of the paragraph, change "filed on Aug. 18, 1994" to -- filed on Mar. 18, 1994 --

Signed and Sealed this

Twenty-first Day of January, 2003

JAMES E. ROGAN
*Director of the United States Patent and Trademark Office*